(12) United States Patent
Leung et al.

(10) Patent No.: US 7,951,696 B2
(45) Date of Patent: May 31, 2011

(54) METHODS FOR SIMULTANEOUSLY FORMING N-TYPE AND P-TYPE DOPED REGIONS USING NON-CONTACT PRINTING PROCESSES

(75) Inventors: Roger Yu-Kwan Leung, San Jose, CA (US); Anil Bhanap, Milpitas, CA (US); Zhe Ding, Shanghai (CN); Nicole Rutherford, Saratoga, CA (US); Wenya Fan, Campbell, CA (US)

(73) Assignee: Honeywell International Inc., Morristown, NJ (US)

( * ) Notice: Subject to any disclaimer, the term of this patent is extended or adjusted under 35 U.S.C. 154(b) by 332 days.

(21) Appl. No.: 12/241,396

(22) Filed: Sep. 30, 2008

(65) Prior Publication Data
US 2010/0081264 A1    Apr. 1, 2010

(51) Int. Cl.
H01L 21/22    (2006.01)
(52) U.S. Cl. ................... 438/548; 257/E21.247
(58) Field of Classification Search .......... 438/548; 257/E21.247, E21.466
See application file for complete search history.

(56) References Cited

U.S. PATENT DOCUMENTS

| | | | |
|---|---|---|---|
| 3,258,434 A | 6/1966 | Mackenzie et al. |
| 3,960,605 A | 6/1976 | Beck et al. |
| 4,102,766 A | 7/1978 | Fey |
| 4,104,091 A | 8/1978 | Evans, Jr. et al. |
| 4,392,180 A | 7/1983 | Nair |
| 4,478,879 A | 10/1984 | Baraona et al. |
| 4,517,403 A | 5/1985 | Morel et al. |
| 4,548,741 A | 10/1985 | Hormadaly |
| 4,578,283 A | 3/1986 | Kirtley et al. |
| 4,707,346 A | 11/1987 | Hormadaly |
| 4,793,862 A | 12/1988 | Ishikawa et al. |
| 4,891,331 A | 1/1990 | Rapp |
| 4,927,770 A | 5/1990 | Swanson |
| 5,053,083 A | 10/1991 | Sinton |
| 5,302,198 A | 4/1994 | Allman |
| 5,399,185 A | 3/1995 | Berthold et al. |
| 5,464,564 A | 11/1995 | Brown |

(Continued)

FOREIGN PATENT DOCUMENTS

CN    101369612    2/2009

(Continued)

OTHER PUBLICATIONS

Horzel, J. et al., A Simple Processing Sequence for Selective Emitters, 26th PVSC, Sep. 30-Oct. 3, 1997.

(Continued)

*Primary Examiner* — Thao P. Le
(74) *Attorney, Agent, or Firm* — Ingrassia Fisher & Lorenz, P.C.

(57) ABSTRACT

Methods for simultaneously forming doped regions of opposite conductivity using non-contact printing processes are provided. In one exemplary embodiment, a method comprises the steps of depositing a first liquid dopant comprising first conductivity-determining type dopant elements overlying a first region of a semiconductor material and depositing a second liquid dopant comprising second conductivity-determining type dopant elements overlying a second region of the semiconductor material. The first conductivity-determining type dopant elements and the second conductivity-determining type dopant elements are of opposite conductivity. At least a portion of the first conductivity-determining type dopant elements and at least a portion of the second conductivity-determining type dopant elements are simultaneously diffused into the first region and into the second region, respectively.

31 Claims, 6 Drawing Sheets

U.S. PATENT DOCUMENTS

| | | | |
|---|---|---|---|
| 5,472,488 A | 12/1995 | Allman |
| 5,510,271 A | 4/1996 | Rohatgi et al. |
| 5,527,389 A | 6/1996 | Rosenblum |
| 5,527,872 A | 6/1996 | Allman |
| 5,591,565 A | 1/1997 | Holdermann et al. |
| 5,614,018 A | 3/1997 | Azuma et al. |
| 5,641,362 A | 6/1997 | Meier |
| 5,661,041 A | 8/1997 | Kano |
| 5,665,845 A | 9/1997 | Allman |
| 5,667,597 A | 9/1997 | Ishihara |
| 5,695,809 A | 12/1997 | Chadha et al. |
| 5,766,964 A | 6/1998 | Rohatgi et al. |
| 5,899,704 A | 5/1999 | Schlosser et al. |
| 5,928,438 A | 7/1999 | Salami et al. |
| 6,091,021 A | 7/2000 | Ruby et al. |
| 6,096,968 A | 8/2000 | Schlosser et al. |
| 6,099,647 A | 8/2000 | Yieh et al. |
| 6,143,976 A | 11/2000 | Endros |
| 6,162,658 A | 12/2000 | Green et al. |
| 6,180,869 B1 | 1/2001 | Meier et al. |
| 6,221,719 B1 | 4/2001 | Franco |
| 6,232,207 B1 | 5/2001 | Schindler |
| 6,251,756 B1 | 6/2001 | Horzel et al. |
| 6,262,359 B1 | 7/2001 | Meier et al. |
| 6,297,134 B1 | 10/2001 | Ui et al. |
| 6,300,267 B1 | 10/2001 | Chen et al. |
| 6,309,060 B1 | 10/2001 | Timmermans-Wang et al. |
| 6,355,581 B1 | 3/2002 | Vassiliev et al. |
| 6,429,037 B1 | 8/2002 | Wenham et al. |
| 6,479,885 B2 | 11/2002 | Buchanan et al. |
| 6,518,087 B1 | 2/2003 | Furusawa et al. |
| 6,552,414 B1 | 4/2003 | Horzel et al. |
| 6,632,730 B1 | 10/2003 | Meier et al. |
| 6,664,631 B2 | 12/2003 | Meier et al. |
| 6,695,903 B1 | 2/2004 | Kubelbeck et al. |
| 6,703,295 B2 | 3/2004 | Meier et al. |
| 6,737,340 B2 | 5/2004 | Meier et al. |
| 6,756,290 B1 | 6/2004 | Bultman |
| 6,773,994 B2 | 8/2004 | Chittipeddi et al. |
| 6,784,520 B2 | 8/2004 | Doi |
| 6,825,104 B2 | 11/2004 | Horzel et al. |
| 6,960,546 B2 | 11/2005 | Caspers et al. |
| 6,998,288 B1 | 2/2006 | Smith et al. |
| 7,029,943 B2 | 4/2006 | Kruhler |
| 7,041,549 B2 | 5/2006 | Ootsuka |
| 7,078,276 B1 | 7/2006 | Zurcher et al. |
| 7,078,324 B2 | 7/2006 | Dudek et al. |
| 7,097,788 B2 | 8/2006 | Kirkor et al. |
| 7,108,733 B2 | 9/2006 | Enokido |
| 7,115,216 B2 | 10/2006 | Carter et al. |
| 7,129,109 B2 | 10/2006 | Munzer et al. |
| 7,135,350 B1 | 11/2006 | Smith et al. |
| 7,144,751 B2 | 12/2006 | Gee et al. |
| 7,170,001 B2 | 1/2007 | Gee et al. |
| 7,186,358 B2 | 3/2007 | McCulloch et al. |
| 7,196,018 B2 | 3/2007 | Szlufcik et al. |
| 7,217,883 B2 | 5/2007 | Munzer |
| 7,278,728 B2 | 10/2007 | Desie et al. |
| 7,332,445 B2 | 2/2008 | Lukas et al. |
| 7,335,555 B2 | 2/2008 | Gee et al. |
| 7,393,723 B2 | 7/2008 | Yamazaki et al. |
| 7,402,448 B2 | 7/2008 | Narayanan et al. |
| 7,456,084 B2 | 11/2008 | Jonczyk et al. |
| 7,459,391 B2 | 12/2008 | Yoshizawa et al. |
| 7,468,485 B1 | 12/2008 | Swanson |
| 7,537,951 B2 | 5/2009 | Gambino et al. |
| 7,572,740 B2 | 8/2009 | Terry et al. |
| 7,615,393 B1 | 11/2009 | Shah et al. |
| 7,633,006 B1 | 12/2009 | Swanson |
| 7,635,600 B2 | 12/2009 | Zhang et al. |
| 7,638,438 B2 | 12/2009 | Eldershaw |
| 2002/0046765 A1 | 4/2002 | Uematsu et al. |
| 2002/0153039 A1 | 10/2002 | Moon et al. |
| 2002/0215303 | 10/2002 | Moon et al. |
| 2003/0008481 A1* | 1/2003 | Ross et al. ............... 438/510 |
| 2003/0134469 A1 | 7/2003 | Horzel et al. |
| 2003/0153141 A1 | 8/2003 | Carter et al. |
| 2004/0063326 A1 | 4/2004 | Szlufcik et al. |
| 2004/0112426 A1 | 6/2004 | Hagino |
| 2004/0242019 A1 | 12/2004 | Klein et al. |
| 2004/0261840 A1 | 12/2004 | Schmidt et al. |
| 2005/0189015 A1 | 9/2005 | Rohatgi et al. |
| 2005/0268963 A1 | 12/2005 | Jordan et al. |
| 2006/0060238 A1 | 3/2006 | Hacke et al. |
| 2006/0162766 A1 | 7/2006 | Gee et al. |
| 2006/0163744 A1 | 7/2006 | Vanheusden et al. |
| 2006/0166429 A1 | 7/2006 | Chaudhry et al. |
| 2006/0237719 A1 | 10/2006 | Colfer et al. |
| 2007/0012355 A1 | 1/2007 | LoCascio et al. |
| 2007/0034251 A1 | 2/2007 | Jonczyk et al. |
| 2007/0075416 A1 | 4/2007 | Anderson et al. |
| 2007/0151598 A1 | 7/2007 | De Ceuster et al. |
| 2007/0157965 A1 | 7/2007 | Park |
| 2007/0215203 A1 | 9/2007 | Ishikawa et al. |
| 2007/0269923 A1 | 11/2007 | Lee et al. |
| 2007/0290283 A1 | 12/2007 | Park et al. |
| 2008/0026550 A1 | 1/2008 | Werner et al. |
| 2008/0042212 A1 | 2/2008 | Kamath et al. |
| 2008/0044964 A1 | 2/2008 | Kamath et al. |
| 2008/0048240 A1 | 2/2008 | Kamath et al. |
| 2008/0076240 A1 | 3/2008 | Veschetti et al. |
| 2008/0092944 A1 | 4/2008 | Rubin |
| 2008/0121279 A1 | 5/2008 | Swanson |
| 2008/0138456 A1 | 6/2008 | Fork et al. |
| 2008/0142075 A1 | 6/2008 | Reddy et al. |
| 2008/0202576 A1 | 8/2008 | Hiesimair |
| 2008/0210298 A1 | 9/2008 | Kuebelbeck et al. |
| 2008/0241986 A1 | 10/2008 | Rohatgi et al. |
| 2008/0241987 A1 | 10/2008 | Rohatgi et al. |
| 2008/0241988 A1 | 10/2008 | Rohatgi et al. |
| 2008/0251121 A1 | 10/2008 | Stone |
| 2008/0264332 A1 | 10/2008 | Sepehry-Fard |
| 2008/0268584 A1 | 10/2008 | Anderson et al. |
| 2008/0290368 A1 | 11/2008 | Rubin |
| 2008/0314288 A1 | 12/2008 | Biro et al. |
| 2009/0007962 A1 | 1/2009 | Wenham et al. |
| 2009/0007965 A1 | 1/2009 | Rohatgi et al. |
| 2009/0017606 A1 | 1/2009 | Fath et al. |
| 2009/0020156 A1 | 1/2009 | Ohtsuka et al. |
| 2009/0020829 A1 | 1/2009 | Chandra et al. |
| 2009/0068474 A1 | 3/2009 | Lower et al. |
| 2009/0068783 A1 | 3/2009 | Borden |
| 2009/0084440 A1 | 4/2009 | Wang et al. |
| 2009/0142875 A1 | 6/2009 | Borden et al. |
| 2009/0142911 A1 | 6/2009 | Asano et al. |
| 2009/0183768 A1 | 7/2009 | Wenham et al. |
| 2009/0194153 A1 | 8/2009 | Hilaii et al. |
| 2009/0227061 A1 | 9/2009 | Bateman et al. |
| 2009/0227097 A1 | 9/2009 | Bateman et al. |
| 2009/0233426 A1 | 9/2009 | Poplavskyy et al. |
| 2009/0239330 A1 | 9/2009 | Vanheusden et al. |
| 2009/0239363 A1 | 9/2009 | Leung et al. |
| 2009/0260684 A1 | 10/2009 | You |
| 2009/0269913 A1* | 10/2009 | Terry et al. ............... 438/558 |
| 2009/0308440 A1 | 12/2009 | Adibi et al. |
| 2009/0314341 A1 | 12/2009 | Borden et al. |
| 2009/0314344 A1 | 12/2009 | Fork et al. |
| 2010/0068848 A1 | 3/2010 | Kuo et al. |

FOREIGN PATENT DOCUMENTS

| | | |
|---|---|---|
| EP | 0195148 A1 | 9/1986 |
| EP | 0381430 A2 | 1/1990 |
| EP | 485122 A1 | 5/1992 |
| EP | 0890980 A2 | 1/1999 |
| EP | 1024523 A1 | 8/2000 |
| EP | 0770265 B1 | 3/2002 |
| EP | 1843389 A1 | 10/2007 |
| EP | 1876651 A1 | 1/2008 |
| JP | 09-036853 A | 11/1997 |
| JP | 2003168807 | 6/2003 |
| JP | 2003168810 | 6/2003 |
| JP | 2003-188393 A | 7/2003 |
| JP | 2003224285 | 8/2003 |
| JP | 2004221149 | 8/2004 |
| JP | 20050308997 | 2/2005 |
| JP | 2007081300 | 3/2007 |
| KR | 10-199-0066346 A1 | 8/1999 |

| | | |
|---|---|---|
| WO | 9715075 | 4/1997 |
| WO | 2006029250 A2 | 3/2006 |
| WO | 2007059577 A1 | 5/2007 |
| WO | 2007059578 A1 | 5/2007 |
| WO | 2007106502 A1 | 9/2007 |
| WO | 2007-111996 A2 | 10/2007 |
| WO | 2007118121 A2 | 10/2007 |
| WO | 2007-129966 A1 | 11/2007 |
| WO | 2008039078 A2 | 4/2008 |
| WO | 2008054473 A2 | 5/2008 |
| WO | 2008085806 A1 | 7/2008 |
| WO | 2008098407 A1 | 8/2008 |
| WO | 2008141415 A1 | 11/2008 |
| WO | 2009010585 A2 | 1/2009 |
| WO | 2009013307 A2 | 1/2009 |
| WO | 2009032359 A2 | 3/2009 |
| WO | 2009052511 A2 | 4/2009 |
| WO | 2009067005 A1 | 5/2009 |
| WO | 2009085224 A2 | 7/2009 |
| WO | 2009088138 A1 | 7/2009 |
| WO | 2009094575 A2 | 7/2009 |
| WO | 2009107920 A1 | 9/2009 |
| WO | 2009116569 A1 | 9/2009 |
| WO | 2009126803 A2 | 10/2009 |
| WO | 2009152378 A1 | 12/2009 |

OTHER PUBLICATIONS

Tonooka, K.: Shimokawa, K; Nishimura, O Fluorescent Properties of Tb-doped Borosilicate Glass Films Prepared by a Sol-gel Method Proceedings of SPIE—The International Society for Optical Engineering, v 4282, p. 193-199, 2001.

Yun, Yongsup; Yoshida, Takanori; Shimazu, Norifumi; Inoue, Yasushi; Saito, Nagahiro; Takai, Osamu Behavior of Various Organosilicon Molecules in PECVD Processes for Hydrocarbon-doped Silicaon Oxide Films Diffusion and Defect Data Pt.B Solid State Phenomena, v 124-126, n PART 1, p. 347-350, 2007, Advances in Nanomaterials and Processing—IUMRS.

Tajima, Nobuo; Ohno, Takahisa; Hamada, Tomoyuki; Yoneda, Katsumi; Kondo, Seiichi; Kobayashi, Nobuyoshi; Shinriki, Manabu; Inaishi, Yoshiaki; Miyazawa, Kazuhiro; Sakota, Kaoru; Hasaka, Satoshi; Inoue, Minoru Carbon-doped Silicon Oxide Films with Hydrocarbon Network Bonds for Low-k Dielectrics, theoretical Investigations Japanese Journal of Applied Physics, Part 1: Regular Papers and Short Notes and Review Papers, v 46, n 9A, p.

Takeda, Satoshi1; Fukawa, Mokoto1 Surface Modification of Sputtered SiO2 Thin Films by Metal Doping Materials Research Society Symposium—Proceedings, v 750, p. 443-448, 2002.

Sabbah, H.; Conde, J.P.; Chu, V.; Zebda, A.; Ababou-Girard, S.; Solal, F.; Godet, C. Thermal Grafting of Fluorinated Molecular Monolayers on Doped Amorphous Silicon surfaces Journal of Applied Physics, v 105, n 6, 2009.

Osada, Yoshihito; Takase, Mitsuo Plasma-polymerized Organosiloxane Membranes Prepared by Simultaneous Doping of i2 Molecules and the Effect on Liquid Permeability Journal of Polymer Science, Part A-1, Polymer Chemistry, v 23, n 9, p 2425-2439, Sep. 1985.

Popov, V.P.1; Safronov, L.N.1; Nikiforov, A.I.1 Atomically Flat Surface of Hydrogen Transferred Si Film with Boron Delta Doped Layer Meeting Abstracts, p. 526, 2005, 207th Meeting of the Electrochemical Society—Meeting Abstracts.

Li, Jiangtian1; Shi, Jianlin1; Zhang, Lingxia1; Hua, Zile1; Jiang, Peng1; Huang, Weimin1; Wei, Chenyang1 A Pre-modification-direct Synthesis Route for the Covalent Incorporation and Monomeric Dispersion of Hydrophobic Organic Chromophores in Mesoporous Silica Films Microporous and Mesoporous Materials, v 111, n 1-3, p. 150-156, Apr. 15, 2008.

A simple processing sequence for selective emitters [Si solarcells]; Horzel, J., Szlufcik, J., Nijs J., Mertens, R, Imec, Heverlee; Photovoltaic Specialists Conference, 1997., Conference Record of the Twenty-Sixth IEEE; Sep. 29-Oct. 3, 1997; pp. 139-142; Meeting Date: Sep. 29, 1997-Oct. 3, 1997; Location: Anaheim, CA USA.

Accuglass P-114A Spin-On Glass, Material Safety Data Sheet, Honeywell International, Oct. 29, 2003, pp. 1-6.

Accuglass P-5S, Product Bulletin, Thin-Film Dielectrics, Honeywell International, 2002, pp. 1-2.

ACCUSPIN Boron; Polymers for All P-Type Diffusion, Honeywell International, 2005, pp. 1-2.

Accuglass P-TTY Product Bulletin, Thin-Film Dielectrics, Honeywell International, 2002, pp. 1-2.

Accuglass P-XXY Spin-On Glass, Material Safety Data Sheet, Honeywell International, May 14, 2003, pp. 1-7.

Spin-On Dopants, Thin Film—Dielectrics, Application Comparision, Honeywell International, 2002, pp. 1-2.

BoronPlus, High Purity Planar Dopants, ISO Certified 3002/14001, Techneglas Technical Products, 2000.

Zable, J.L., Splatter During Ink Jet Printing, IBM J. Res. Develop., Jul. 1977, pp. 315-320.

Techniglas Technical Products, Boron Plus, Product Information, pp. 1-3.

Diffusion Technology Phosphorus Spin-On Dopants P-8 Series (P-8545, P-854 (2:1), Material Safety Data Sheet, Honeywell International, Apr. 25, 2003, p. 1-7.

B-30, B-40, B-50, B-60 Spin-On Dopants, Material Safety Data Sheet, Honeywell International, Apr. 29, 2003, pp. 1-7.

Accuglass P-TTY a Series Phosphosilicate Spin-On Glasses, Allied Signal, Inc. Planarization and Diffusion Products, May, 1992, pp. 1-2.

* cited by examiner

METHODS FOR SIMULTANEOUSLY FORMING N-TYPE AND P-TYPE DOPED REGIONS USING NON-CONTACT PRINTING PROCESSES

FIELD OF THE INVENTION

The present invention generally relates to methods for fabricating semiconductor devices, and more particularly relates to methods for simultaneously forming an n-type doped region and a p-type doped region in a semiconductor material using non-contact printing processes.

BACKGROUND OF THE INVENTION

Doping of semiconductor materials with conductivity-determining type dopant elements, such as n-type and p-type dopant elements, is used in a variety of applications that require modification of the electrical characteristics of the semiconductor materials. Typically, elements such as phosphorous, arsenic, or antimony are used to fabricate n-type doped semiconductor materials, while boron is used to fabricate p-type doped semiconductor materials.

Figure 1:
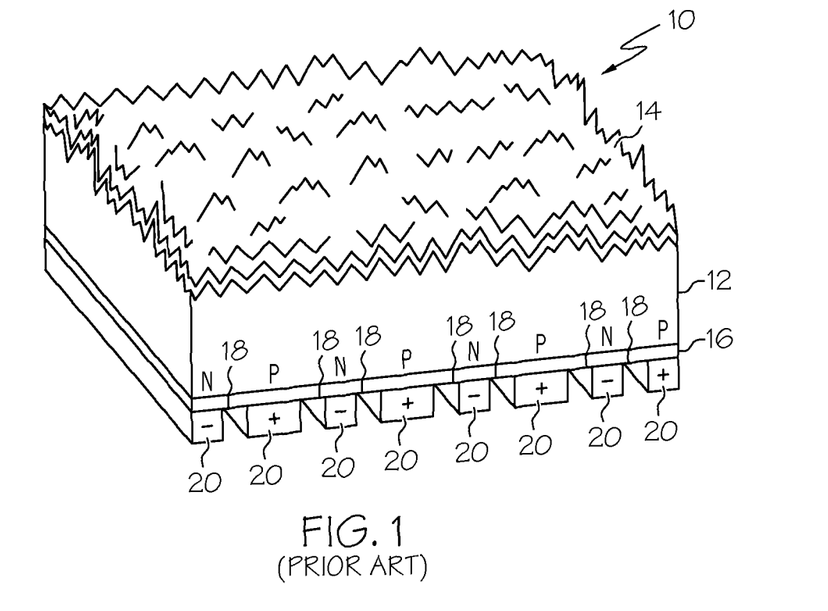
FIG. 1 is a schematic illustration of a conventional solar cell with back side contacts.

In some applications such as, for example, solar cells, it is desirable to dope a semiconductor substrate with dopant-type elements of different conductivity in a pattern having very fine lines or features. FIG. 1 illustrates one type of solar cell 10. Solar cell 10 has a silicon substrate 12 having a light-receiving front side 14 and a back side 16 and is provided with a basic doping, wherein the basic doping can be of the n-type or of the p-type. The light-receiving front side 14 has a rough or textured surface that serves as a light trap, preventing absorbed light from being reflected back out of the solar cell. Metal contacts 20 of the solar cell are formed on the back side 16 of the wafer. The silicon wafer is doped at the backside relative to the metal contacts, thus forming p-n junctions 18 within the silicon substrate. Photons from light are absorbed by the light-receiving side 14 to the p-n junctions where charge carriers, i.e., electrons and holes, are separated and conducted to the metal contacts, thus generating electricity. Solar cell 10 has an advantage over other types of solar cells in that all of the metal contacts of the cell are on the back side 16. In this regard, there is no shading of the light-receiving front side 14 of the solar cell by the contacts. However, for all contacts to be formed on the back side 16, the doped regions adjacent the contacts have to be quite narrow.

Present-day methods of doping, such as photolithography and screen printing, present significant drawbacks for forming such narrow features. For example, it is prohibitively difficult, if not impossible, to obtain very fine and/or narrow doped regions in a semiconductor substrate using screen printing. In addition, while doping of substrates in fine-lined patterns is possible with photolithography, using photolithography to form different doped regions is an expensive and time consuming process, involving multiple deposition, masking, and etching steps. In addition, both photolithography and screen printing involve contact with the semiconductor substrate. However, in applications such as solar cells, the semiconductor substrates are becoming very thin. Contact with thin substrates often results in breaking of the substrates. Moreover, because photolithography and screen printing use custom designed masks and screens, respectively, to dope the semiconductor substrate in a pattern, reconfiguration of the doping pattern is expensive because new masks or screens have to be developed.

Accordingly, it is desirable to provide methods for fabricating semiconductor devices by depositing dopants comprising conductivity-determining type dopant elements of opposite conductivity overlying a semiconductor material using non-contact printing processes and simultaneously diffusing the elements into the semiconductor material. In addition, it is desirable to provide methods for fabricating semiconductor devices by depositing a liquid dopant comprising n-type elements and a liquid dopant comprising p-type elements overlying a semiconductor material and diffusing the elements into the semiconductor material using one diffusion step. It is also desirable to provide methods for fabricating semiconductor devices with fine or thin doped features. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A method for fabricating a semiconductor device is provided in accordance with an exemplary embodiment of the present invention. The method comprises the steps of depositing a first liquid dopant comprising first conductivity-determining type dopant elements overlying a first region of a semiconductor material and depositing a second liquid dopant comprising second conductivity-determining type dopant elements overlying a second region of the semiconductor material. At least a portion of the first conductivity-determining type dopant elements and at least a portion of the second conductivity-determining type dopant elements are simultaneously diffused into the first region and into the second region, respectively.

A method for fabricating a semiconductor device is provided in accordance with another exemplary embodiment of the present invention. The method comprises the steps of depositing a first dopant comprising n-type dopant elements overlying a first region of a semiconductor material using a non-contact printing process and depositing a second dopant comprising p-type dopant elements overlying a second region of the semiconductor material. The p-type dopant elements and the n-type dopant elements have opposite conductivity. At least a portion of the n-type dopant elements and at least a portion of the p-type dopant elements are simultaneously diffused into the first region and into the second region, respectively.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 2:
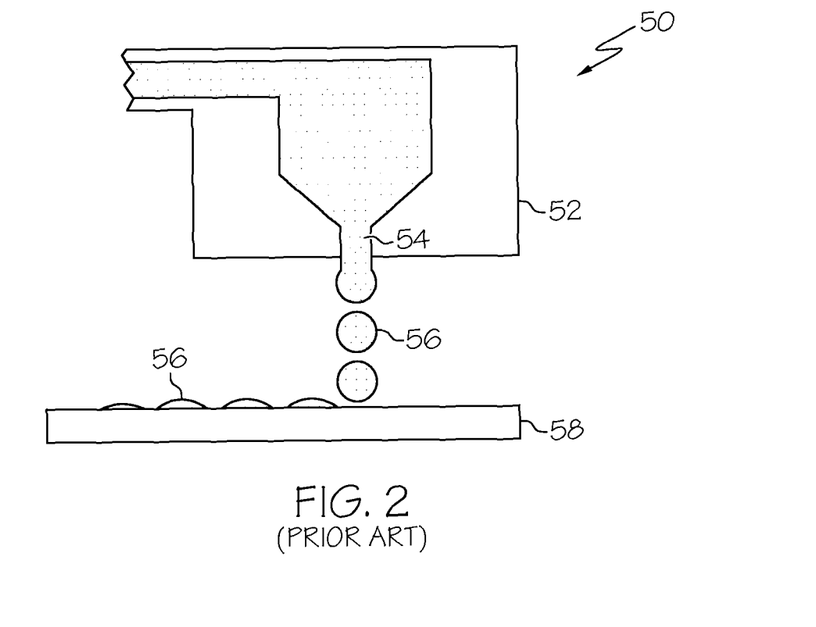
FIG. 2 is a cross-sectional view of an inkjet printer mechanism distributing ink on a substrate.
Figure 3:
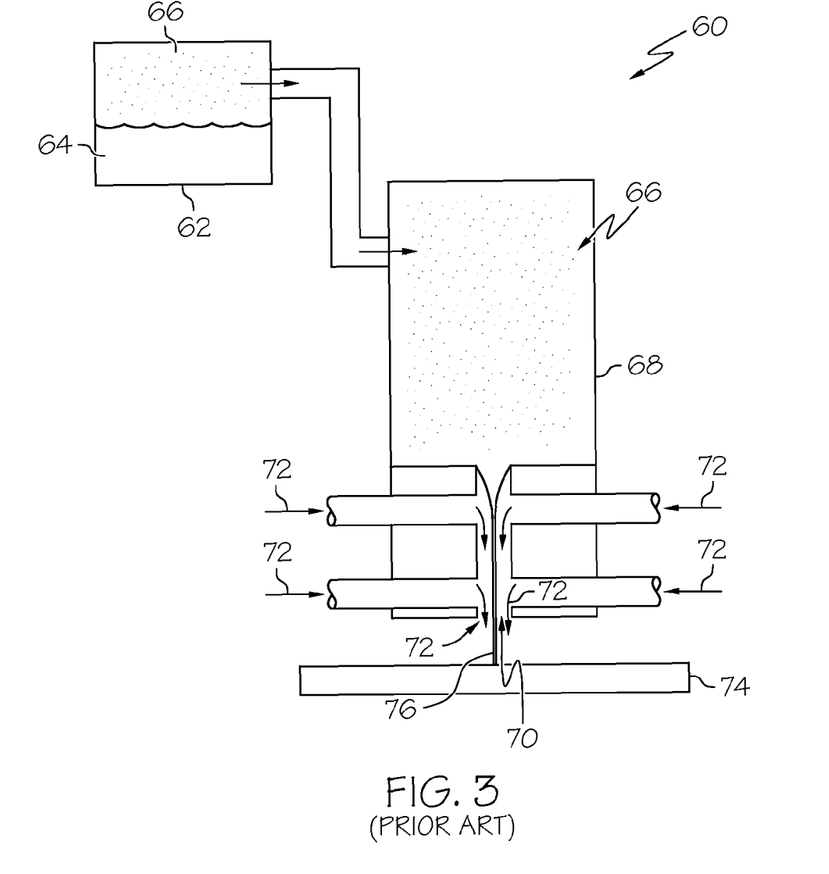
FIG. 3 is a cross-sectional view of an aerosol jet printer mechanism distributing ink on a substrate.

Methods for simultaneously forming doped regions having opposite conductivity in a semiconductor material using non-contact printing processes are provided herein. As used herein, the term "non-contact printing process" means a process for depositing a liquid conductivity-determining type dopant selectively on a semiconductor material in a predetermined patterned without the use of a mask, screen, or other such device. Examples of non-contact printing processes include but are not limited to "inkjet printing" and "aerosol jet printing." Typically, the terms "inkjet printing," an "inkjet printing process," "aerosol jet printing," and an "aerosol jet printing process" refer to a non-contact printing process whereby a liquid is projected from a nozzle directly onto a substrate to form a desired pattern. In an inkjet printing mechanism 50 of an inkjet printer, as illustrated in FIG. 2, a print head 52 has several tiny nozzles 54, also called jets. As a substrate 58 moves past the print head 52, or as the print head 52 moves past the substrate, the nozzles spray or "jet" ink 56 onto the substrate in tiny drops, forming images of a desired pattern. In an aerosol jet printing mechanism 60, illustrated in FIG. 3, a mist generator or nebulizer 62 atomizes a liquid 64. The atomized fluid 66 is aerodynamically focused using a flow guidance deposition head 68, which creates an annular flow of sheath gas, indicated by arrows 72, to collimate the atomized fluid 66. The co-axial flow exits the flow guidance head 68 through a nozzle 70 directed at the substrate 74 and focuses a stream 76 of the atomized material to as small as a tenth of the size of the nozzle orifice (typically 100 microns (µm)). Patterning is accomplished by attaching the substrate to a computer-controlled platen, or by translating the flow guidance head while the substrate position remains fixed.

Such non-contact printing processes are particularly attractive processes for fabricating doped regions in semiconductor substrates for a variety of reasons. First, unlike screen printing or photolithography, only an ink used to form the doped regions touches or contacts the surface of the substrate upon which the ink is applied. Thus, because the breaking of semiconductor substrates could be minimized compared to other known processes, non-contact printing processes are suitable for a variety of substrates, including rigid and flexible substrates. In addition, non-contact printing processes are additive processes, meaning that the ink is applied to the substrate in the desired pattern. Thus, steps for removing material after the printing process, such as is required in photolithography, are eliminated. Further, because non-contact printing processes are additive processes, they are suitable for substrates having smooth, rough, or textured surfaces. Non-contact printing processes also permit the formation of very fine features on semiconductor substrates. In one embodiment, features, such as, for example, lines, dots, rectangles, circles, or other geometric shapes, having at least one dimension of less than about 200 µm can be formed. In another exemplary embodiment, features having at least one dimension of less than about 100 µm can be formed. In a preferred embodiment, features having at least one dimension of less than about 20 µm can be formed. In addition, because non-contact printing processes involve digital computer printers that can be programmed with a selected pattern to be formed on a substrate or that can be provided the pattern from a host computer, no new masks or screens need to be produced when a change in the pattern is desired. All of the above reasons make non-contact printing processes cost-efficient processes for fabricating doped regions in semiconductor substrates, allowing for increased throughput compared to screen printing and photolithography.

Figure 4:
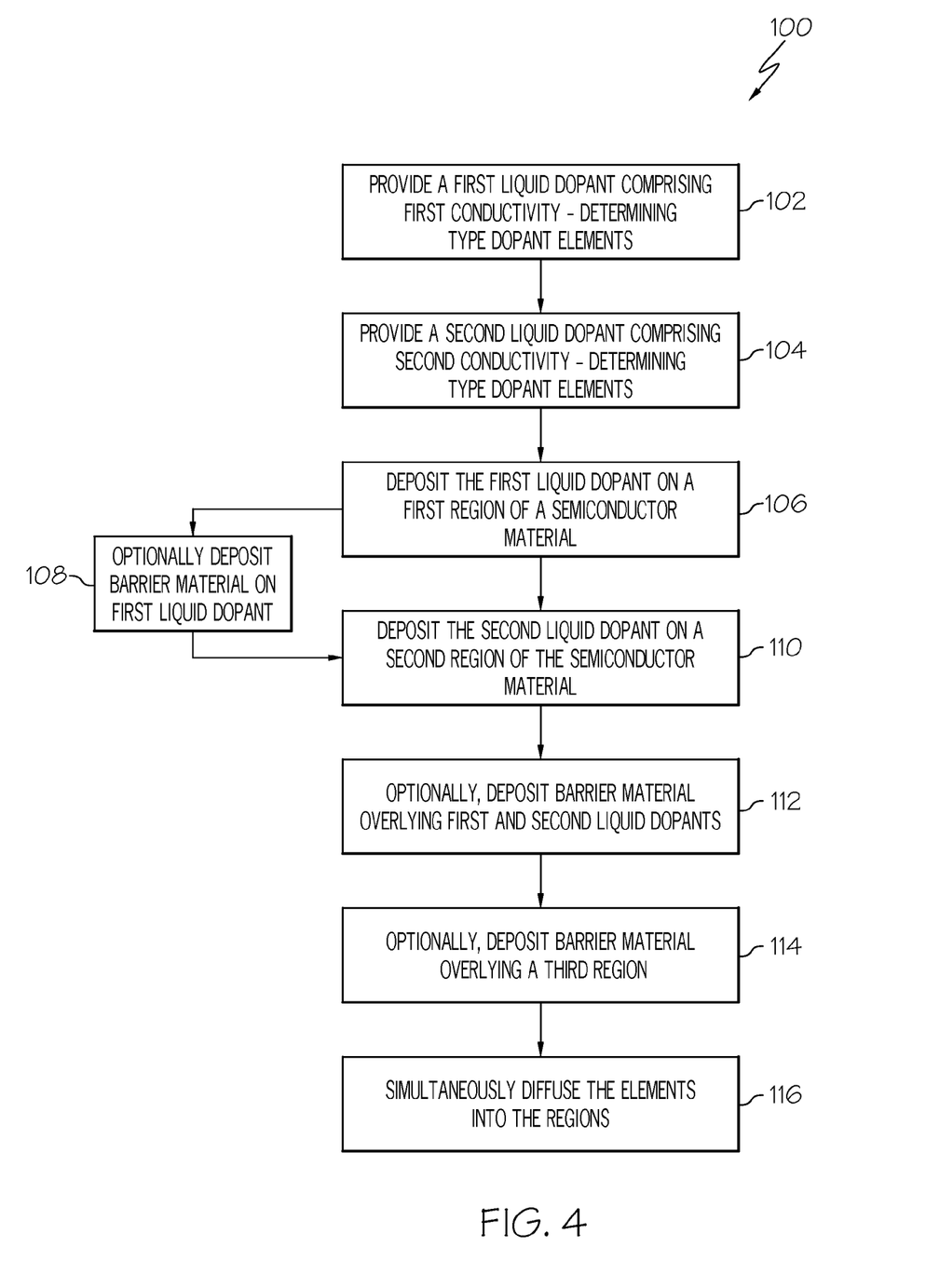
FIG. 4 is a flowchart of a method for simultaneously forming doped regions having opposite conductivity in accordance with an exemplary embodiment.

FIG. 4 illustrates a method 100 for fabricating a semiconductor device by simultaneously forming doped regions of opposite conductivity in a semiconductor material using a non-contact printing process, in accordance with an exemplary embodiment of the present invention. As used herein, "semiconductor device" includes any electronic device that comprises a semiconductor material in which doped regions are formed. As used herein, the term "semiconductor material" will be used to encompass monocrystalline silicon materials, including the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other semiconductor materials such as relatively pure and impurity-doped germanium, gallium arsenide, zinc oxide, and the like. The semiconductor material may be a semiconductor substrate or wafer or may comprise any semiconductor material layer overlying a semiconductor substrate or wafer. In this regard, the method 100 can be used to fabricate a variety of semiconductor devices including, but not limited to, microelectronics, solar cells and other photovoltaic devices, displays, RFID components, microelectromechanical systems (MEMS) devices, optical devices such as microlenses, medical devices, and the like.

The method 100 includes the step of providing a first liquid dopant comprising first conductivity-determining type dopant elements (step 102). In accordance with an exemplary embodiment of the present invention, the first liquid dopant comprises the appropriate conductivity-determining type dopant elements that are required for the doping. For example, for forming n-type doped regions, the first liquid dopant includes the n-type dopant elements phosphorous, arsenic, antimony, or combinations thereof, in an ionic state, as part of a compound, or as a combination of both. For forming p-type doped regions, the first liquid dopant comprises the p-type dopant element boron, in an ionic state, as part of a compound, or as a combination of both. The first liquid dopant may comprise any suitable liquid carrier comprising the conductivity-determining type dopant elements. One example of a first liquid dopant includes a liquid dopant comprising conductivity-determining type dopant elements combined with a silicate carrier. The terms "silicate" and "silicate carrier" are used herein to encompass silicon- and oxygen-containing compounds including, but not limited to, silicates, including organosilicates, siloxanes, silsesquioxanes, and the like. In one exemplary embodiment, suitable silicate carriers include commercially available silicate carriers such as, for example, USG-50, 103AS, 203AS, T30 and T111, all available from Honeywell International of Morristown, N.J. In another exemplary embodiment, a silicate carrier may be formed by combining at least one hydrolyzable silane with at least one hydrogen ion contributor to undergo hydrolysis and polycondensation in a sol-gel reaction to form the silicate carrier. The first liquid dopant also may comprise other components or additives such as liquid mediums, pH modifiers, solvents, viscosity modifiers, dispersants, surfactants, polymerization inhibitors, wetting agents, antifoaming agents, detergents and other surface-tension modifiers, flame retardants, pigments, plasticizers, thickeners, rheology modifiers, and mixtures thereof.

The method 100 further includes the step of providing a second liquid dopant comprising second conductivity-determining type dopant elements (step 104), which step can be performed before, during, or after the step of providing the first liquid dopant. The second conductivity-determining type dopant elements are of the opposite conductivity to the first conductivity-determining type dopant elements. In other words, the first conductivity-determining type dopant elements can be of the n type and the second conductivity-determining type dopant elements can be of the p type, or vice versa. In this regard, two different regions of the semiconductor material with opposite conductivity can be formed. The concentration of the conductivity-determining type dopant elements in the first and second liquid dopants may depend on such factors as the desired concentration of the resulting doped first and second regions and the depth to which the conductivity-determining type dopant elements are to diffuse. For example, to form p-n junctions of a solar cell, such as solar cell 10 of FIG. 1, the concentration of the dopant elements may be in the range of from about $10^{19}$ to about $10^{21}$ atoms/cm$^3$.

The second liquid dopant may comprise any suitable liquid carrier comprising the second conductivity-determining type elements. One example of a second liquid dopant includes a liquid dopant comprising the second conductivity-determining type dopant elements combined with a silicate carrier. The second liquid dopant also may comprise other components or additives such as liquid mediums, pH modifiers, solvents, viscosity modifiers, dispersants, surfactants, polymerization inhibitors, wetting agents, antifoaming agents, detergents and other surface-tension modifiers, flame retardants, pigments, plasticizers, thickeners, rheology modifiers, and mixtures thereof. In addition to differing in conductivity-determining type elements, the first and second liquid dopants can differ in concentration of the respective conductivity-determining type dopant elements. In this regard, as described in more detail below, the concentration of the conductivity-determining type dopant elements in the dopants can be such as to at least facilitate control of the concentration of the subsequently-formed doped regions and the junction depth of the regions. It will be understood that compositions of the first and second liquid dopants also may be formulated in any other suitable manner that permits control of the concentration and junction depth of the subsequently-formed doped regions.

Method 100 continues in accordance with an exemplary embodiment of the present invention with deposition of the first liquid dopant overlying a first region of the semiconductor material (step 106). The first liquid dopant can be deposited overlying the first region using any suitable non-contact printing process that can achieve localized-doping. As used herein, the term "overlying" encompasses the terms "on" and "over". Accordingly, the first liquid dopant can be applied directly onto the semiconductor material or may be deposited over the semiconductor material such that one or more other materials are interposed between the dopant and the semiconductor material. Examples of materials that may be interposed between the first liquid dopant and the semiconductor material are those materials that do not obstruct diffusion of the dopant elements into the semiconductor material during annealing. Such materials include phosphosilicate glass or borosilicate glass that form on a silicon material during formation of P-well regions or N-well regions therein. Typically such materials are removed by deglazing before dopants are deposited on the silicon material; however, in various embodiments, it may be preferable to omit the deglazing process, thereby permitting the materials to remain on the semiconductor material.

The first liquid dopant is applied overlying a first region of the semiconductor material according to a pattern that is stored in or otherwise supplied to an inkjet printer or an aerosol jet printer or other printer that can achieve localized doping. An example of an inkjet printer suitable for use includes, but is not limited to, Dimatix Inkjet Printer Model DMP 2811 available from Fujifilm Dimatix, Inc. of Santa Clara, Calif. An example of an aerosol jet printer suitable for use includes, but is not limited to, an M3D Aerosol Jet Deposition System available from Optomec, Inc. of Albuquerque, N.M. Preferably, the first liquid dopant is applied to the semiconductor material at a temperature in the range of about 15° C. to about 80° C. in a humidity of about 20 to about 80%. In addition to the concentration of conductivity-determining type dopant elements in the first liquid dopant, the thickness to which the first liquid dopant is deposited on the first region may be selected so as to facilitate control of the concentration and junction depth of the subsequently-formed doped first region.

Figure 5:
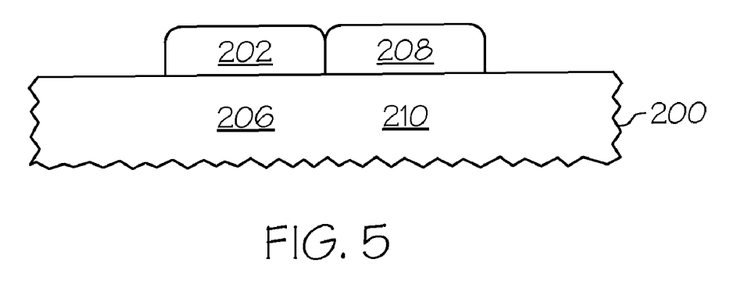
FIG. 5 is a schematic cross-sectional view of a first liquid dopant overlying a first region of a semiconductor material and a second liquid dopant overlying a second region of the semiconductor material, wherein the first region and second region are substantially mutually exclusive, in accordance with an exemplary embodiment of the present invention.

After deposition of the first liquid dopant, the second liquid dopant is deposited overlying a second region of the semiconductor material (step 110). In one exemplary embodiment of the present invention, as illustrated in FIG. 5, the first liquid dopant 202 is deposited by a non-contact printing process overlying a first region 206 of the semiconductor material 200 and the second liquid dopant 208 then is deposited, also by a non-contact printing process, overlying a second region 210 of the semiconductor material. In one exemplary embodiment, the second region 210 is substantially mutually exclusive of the first region 206. However, it will be appreciated that the invention is not so limited and that partial or complete overlapping of the second liquid dopant overlying the first liquid dopant is contemplated herein. In one exemplary embodiment, such as during the fabrication of back-side contacts of a solar cell, the second liquid dopant is deposited adjacent or at least proximate to the first liquid dopant so that n-type doped regions are formed adjacent or proximate to p-type doped regions to form p-n junctions. The thickness of the first liquid dopant can be such as to prevent (or at least minimize) conductivity-determining type dopant elements that vaporize from the second liquid dopant from diffusing through the first liquid dopant into the first region. Similarly, the thickness of the second liquid dopant can be such as to prevent (or at least minimize) conductivity-determining type elements that vaporize from the first liquid dopant from diffusing through the second liquid dopant into the second region. Thus, the first liquid dopant provides first conductivity-determining type elements for doping into the first region and also serves as a barrier to prevent or minimize the diffusion of the second conductivity-determining type elements into the first region through vapor phase transport. Likewise, the second liquid dopant provides second conductivity-determining type elements for doping into the second region and also serves as a barrier to prevent or minimize the diffusion of the first conductivity-determining type elements into the second region through vapor phase transport.

Figure 9:
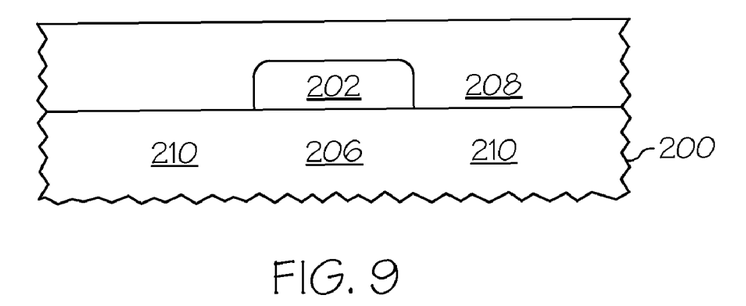
FIG. 9 is a schematic cross-sectional view of a first liquid dopant overlying a first region of a semiconductor material and a second liquid dopant overlying a second region of the semiconductor material and the first liquid dopant, in accordance with an exemplary embodiment of the present invention.

In another exemplary embodiment, as illustrated in FIGS. 4 and 9, after the deposition of first liquid dopant 202, the second liquid dopant 208 is deposited to overlie the second region 210 of the semiconductor material 200 and at least partially overlie the first liquid dopant 202 overlying the first region 206 of the semiconductor material 204. The second liquid dopant may be deposited using spin-on or spray-on techniques, as described above. To prevent diffusion of the dopant elements of second liquid dopant 208 from diffusing through first liquid dopant 202 and into first region 206, the first liquid dopant can be deposited to a thickness sufficient to prevent or at least minimize such diffusion during annealing. The thicknesses of the first liquid dopant and the second liquid dopant will depend on the concentration of the dopant elements in the liquid dopants and on the time and temperature of the annealing process.

Figure 6:
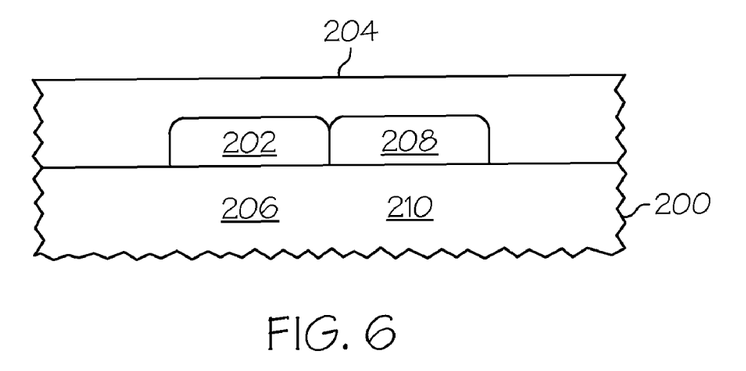
FIG. 6 is a schematic cross-sectional view of the liquid dopants of FIG. 5 with an overlying barrier material, in accordance with an exemplary embodiment of the present invention.

In an optional embodiment, after deposition of the first liquid dopant 202 and the second liquid dopant 208, a barrier material 204 is deposited overlying the liquid dopants (step 112), as illustrated in FIG. 6. The barrier material is comprised of any material that does not comprise the dopant elements (that is, phosphorous, arsenic, antimony, combinations thereof, or boron, in an ionic state, as part of a compound, or as a combination of both) of the liquid dopants and that is thermally stable up to temperatures of about 1100° C. so that it maintains its physical and/or chemical integrity during annealing of the dopants, as described in more detail below. The barrier material also is comprised of a material that can be selectively removed from the semiconductor material, that is, it can be removed from the semiconductor material using an etchant that does not etch or otherwise remove a portion of the semiconductor material. In addition, the barrier material is comprised of a material that can function as a barrier to diffusion of dopant elements that vaporize from and into the first and second liquid dopants. In this regard, the barrier material prevents or at least minimizes vapor diffusion of the dopant elements from the first and second liquid dopants ("out-diffusion") and into the other respective liquid dopant and/or into the semiconductor material ("in-diffusion"). By preventing or at least minimizing out-diffusion, the barrier material maintains the concentrations of the dopant elements in the liquid dopants so that, upon annealing as discussed below, the concentration of the subsequently-formed doped regions are not compromised.

Figure 7:
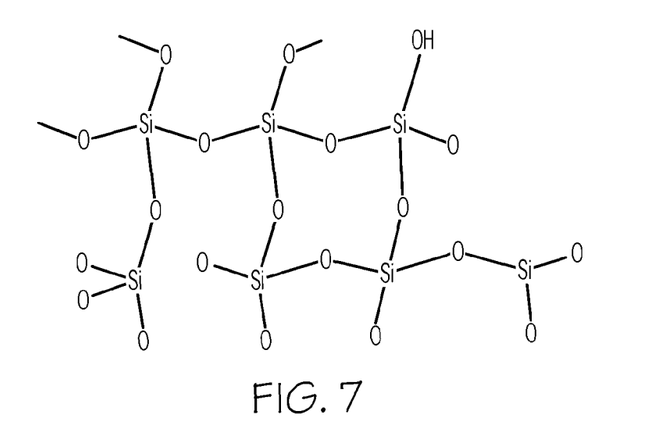
FIG. 7 is an illustration of a portion of a molecular structure of a silicate.
Figure 8:
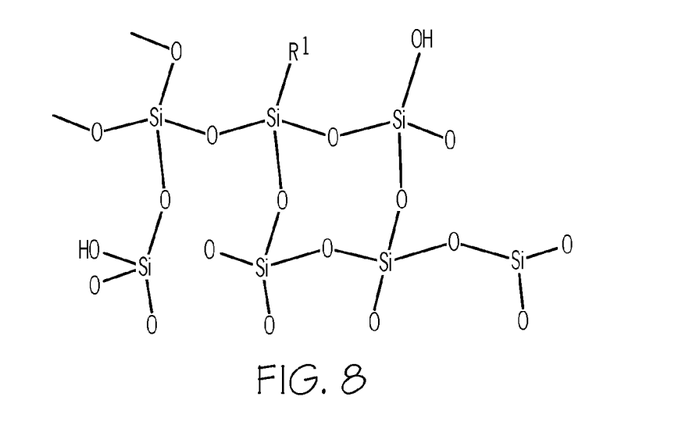
FIG. 8 is an illustration of a portion of a molecular structure of a siloxane.

Examples of barrier materials suitable for use include silicon oxides such as silicon dioxide ($SiO_2$), silicon nitrides such as silicon nitride ($Si_3N_4$), silicon carbides such as silicon carbide (SiC), silicates, titanium oxide ($TiO_2$), alumina ($Al_2O_3$), barium titanate ($BaTiO_3$), and the like. The term "silicate" is used herein to encompass silicon- and oxygen-containing compounds including, but not limited to, siloxanes, silsesquioxanes, silicates, including organosilicates, and the like. The backbone structure of a silicon-oxygen silicate is illustrated in FIG. 7 and the backbone structure of a silicon-oxygen siloxane is illustrated in FIG. 8. In one exemplary embodiment, suitable silicates include commercially available silicates such as, for example, USG-50, 103AS, 203AS, T30 and T111, all available from Honeywell International of Morristown, N.J.

The barrier material can be spun onto the semiconductor material using a spin-on technique comprising spinning the semiconductor material at a spin speed of up to 5000 revolutions per minute or even higher while spraying the barrier material onto a spinning semiconductor material at a desired fluid pressure. Spinning of the semiconductor material causes the barrier material to spread outward substantially evenly across the semiconductor material. The barrier material alternatively can be deposited using a spray-on technique comprising spraying the barrier material onto an unmoving semiconductor material at a desired fluid pressure at a position substantially at the center of the material. The fluid pressure causes the barrier material to spread radially and substantially evenly across the semiconductor material. The barrier material also can be applied by chemical vapor deposition (CVD) to form a silicon dioxide dense layer. In one embodiment, the barrier material is deposited via CVD using either tetraorthosilicate (TEOS) or silane oxide overlying the first liquid dopant, the second liquid dopant, and any region not covered by the first and the second liquid dopants. For example, a mixture of TEOS, oxygen and hydrogen can be used to deposit silicon oxide at 400° C.

Figure 10:
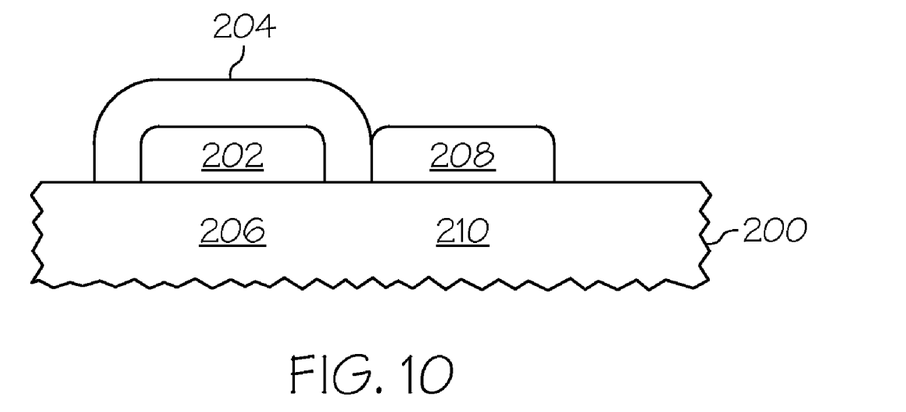
FIG. 10 is a schematic cross-sectional view of a barrier material overlying a first liquid dopant disposed on a first region of a semiconductor material and a second liquid dopant overlying a second region of the semiconductor material, wherein the first region and second region are substantially mutually exclusive, in accordance with an exemplary embodiment of the present invention.

In a further exemplary embodiment, as illustrated in FIGS. 4 and 10, after the deposition of the first liquid dopant 202, a barrier material 204 is deposited overlying the first liquid dopant 202 using a non-contact printing process (step 108), and the second liquid dopant 208 subsequently is deposited overlying second region 210 of semiconductor material 200 also using a non-contact printing process (step 110). Preferably, the barrier material is deposited with the same pattern as used to deposit the first liquid dopant. The barrier material prevents or at least minimizes diffusion of the dopant elements from the second liquid dopant into the first liquid dopant and from the first liquid dopant into the second liquid dopant. In addition, by preventing or at least minimizing out-diffusion of the dopant elements from the first liquid dopant, the barrier layer maintains the concentration of the dopant elements in the first liquid dopant so that the concentration of the doped first region formed upon annealing, as described in more detail below, is not compromised. The barrier material may comprise any of the materials described above with reference to the barrier material of step 112 of FIG. 4.

Figure 11:
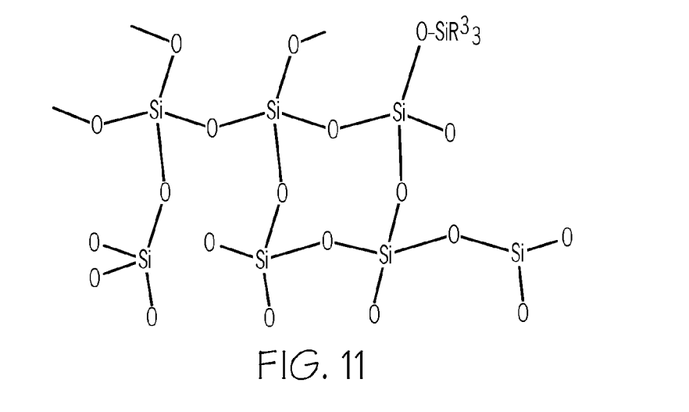
FIG. 11 is an illustration of a portion of a molecular structure of an end-capped silicate.
Figure 12:
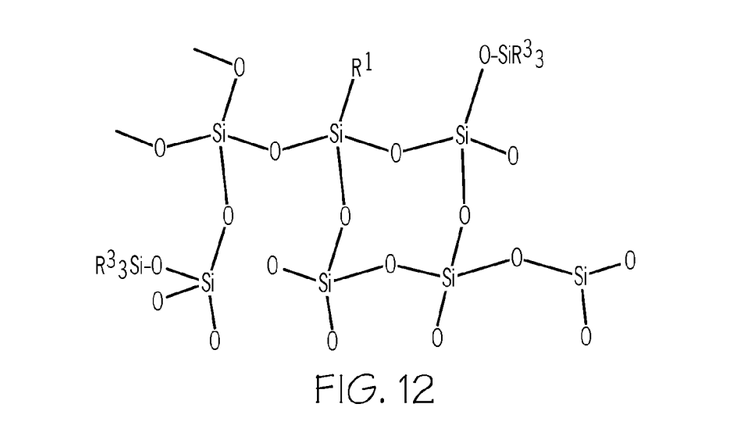
FIG. 12 is an illustration of a portion of a molecular structure of an end-capped siloxane.

If the barrier material comprises a silicate, it may be desirable for the silicate barrier material to be end-capped with a capping agent to minimize or eliminate clogging of printer nozzles and print heads due to gelation of the silicate. End-capping replaces the unreacted condensable (cross-linkable) group (e.g., —OH or —OR, where R is a methyl, ethyl, acetyl, or other alkyl group) of the silicate with a non-condensable (non-cross-linkable) alkylsilyl group or arylsilyl group ($-SiR^3_3$), where $R^3$ comprises one or more of the same or different alkyl and/or aryl groups, to become $-OSiR^3_3$, thus reducing or, preferably, preventing gelation of the silicate. FIGS. 11 and 12 illustrate the silicate of FIG. 7 and the siloxane of FIG. 8, respectively, with end-capping. The total carbon content of the resulting end-capped dopant is in the range of about 0 to about 25 wt. %. The carbon content of the silicate includes carbon components from end-capping group $R^3$ and from mid-chain group $R^1$. Suitable capping agents include acetoxytrimethylsilane, chlorotrimethylsilane, methoxytrimethylsilane, trimethylethoxysilane, triethylsilanol, triethylethoxysilane, and the like, and combinations thereof. The degree of end-capping is dependent on the silicate polymer size, the nozzle diameter, and the printing requirements. Preferably, the weight percent of the end-capping group of the end-capped silicate is about 0 to about 20% of the silicate. In a more preferred embodiment, the weight percent of the end-capping group of the end-capped silicate is no greater than about 5% of the silicate.

Figure 13:
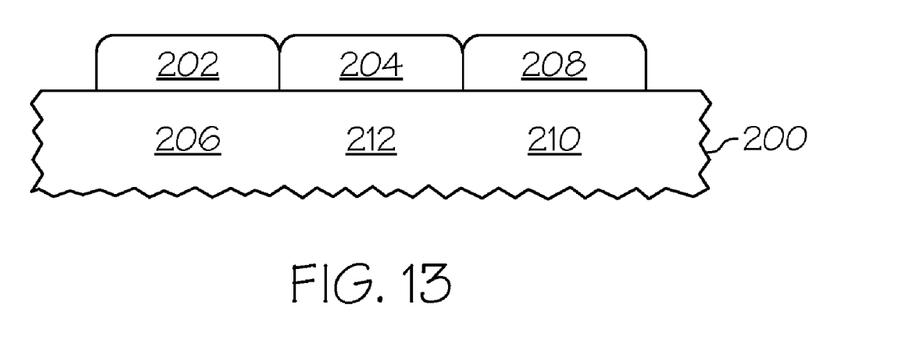
FIG. 13 is a schematic cross-sectional view of a first liquid dopant overlying a first region of a semiconductor material, a second liquid dopant overlying a second region of the semiconductor material, and a barrier material overlying a third region of the semiconductor material, wherein the first region, the second region, and the third region are substantially mutually exclusive, in accordance with an exemplary embodiment of the present invention.

Referring to FIGS. 4 and 13, in another exemplary embodiment, after the deposition of the first liquid dopant 202 overlying the first region 206 (step 106), the second liquid dopant 208 is deposited overlying the second region 210 using a non-contact printing process (step 110), and the barrier material 204 is deposited overlying a third region 212 that is substantially mutually exclusive of the first region and the second region, such as, for example, a region disposed between the first region 206 and the second region 210 (step 114). So as not to overlap in any substantial manner the first liquid dopant 202 or the second liquid dopant 208, barrier material 204 also is deposited using a non-contact printing process. The barrier material 204 prevents or at least minimizes the "in-diffusion" of the conductivity-determining type elements of both the first and second liquid dopants into the third region 212 through vapor phase transport. In an alternative embodiment, the barrier material can be deposited by spin-coating or spray-coating techniques or by a vapor deposition process such as CVD, patterned, and heat-treated before the deposition of the first and second liquid dopants. The barrier material may comprise any of the materials described above with reference to the barrier material of step 112 of FIG. 4.

Returning back to FIG. 4, once the first liquid dopant and the second liquid dopant are deposited overlying the semiconductor material, the conductivity-determining type elements are caused to simultaneously diffuse from the dopants into the first region and the second region, respectively, of the semiconductor material (step 116). The diffusion may be effected, for example, by subjecting the semiconductor material to a high-temperature thermal treatment or "anneal" to cause the conductivity-determining type elements, in an ionic state or otherwise, of the dopants to diffuse into the semiconductor material, thus forming two regions within the semiconductor material having different conductivities. The time duration and the temperature of the anneal is determined by such factors as the initial dopant concentrations of the first liquid dopant and the second liquid dopant, the thickness of the dopant deposits, the desired concentration of the resulting first and second regions, and the depth to which the conductivity-determining type elements are to diffuse. The anneal can be performed using any suitable heat-generating method, such as, for example, thermal annealing, infrared heating, laser heating, microwave heating, a combination thereof, and the like. In one exemplary embodiment of the present invention, the semiconductor material is placed inside an oven wherein the temperature is ramped up to a temperature in the range of about 850° C. to about 1100° C. and the substrate is baked at this temperature for about 2 to about 90 minutes. Annealing also may be carried out in an in-line furnace to increase throughput. The annealing atmosphere may contain 0 to 100% oxygen in an oxygen/nitrogen or oxygen/argon mixture. In a preferred embodiment, the substrate is subjected to an anneal temperature of about 1050° C. for about 10 minutes in an oxygen ambient. As noted above, upon annealing, the first region and the second region of the semiconductor material are doped with conductivity-determining type dopant elements of opposite conductivity such that an n-type doped region and a p-type doped region are formed substantially simultaneously.

In an optional embodiment of the present invention, after causing the dopant elements to diffuse from the liquid dopants into the semiconductor material, the barrier material, if present, is removed from the semiconductor material. The barrier material may be removed using any suitable etchant and/or cleaner that is formulated to remove the diffusion barrier material without significant etching or removal of the semiconductor material. Deglazing of any dopant residue and fabrication of the semiconductor device then may continue using known materials and processes. In a preferred embodiment of the invention, the barrier material and any dopant residue are removed together in a single deglazing step.

The following is an example of a method for fabricating doped regions of opposite conductivity in a semiconductor material. The example is provided for illustration purposes only and is not meant to limit the various embodiments of the present invention in any way.

EXAMPLE

Synthesis of Printable Boron Ink: About 1100 grams (gm) B30 borosilicate, available from Honeywell International of Morristown, N.J., was mixed with 110 gm acetoxytrimethylsilane and left at room temperature for about three hours to form an end-capped boron silicate ink. The end-capped boron silicate ink then was concentrated by distilling off about 908 gm solvent in a rotary evaporator while keeping the solution at a temperature below 23° C. The final weight of the end-capped boron silicate ink was 302 gm. 302 gm ethanol was added to 302 gm of the end-capped boron silicate. A final end-capped boron silicate ink was prepared by adding 10.0 gm boric acid to the 604 gm solution, stirring to dissolve the boric acid, and then filtering using a 0.2 micron (μm) nylon filter. The composition of the final end-capped boron silicate ink was 49.2 weight percent (wt. %) end-capped boron silicate ink, 49.2 wt. % ethanol, and 1.6 wt. % boric acid. The viscosity was about 3.5 centipoise (cp) at 21° C.

Synthesis of Printable Phosphorus Ink: Approximately 107.7 gm 2-propanol, 12.8 gm 85% phosphoric acid, 23.9 gm tetraethyl orthosilicate, 19.4 gm acetic anhydride and 1.45 gm deionized (DI) water were added to a 500 ml flask. The solution was refluxed for 4 hours to produce a phosphosilicate solution. 25.6 gm of the phosphosilicate solution was mixed with 2.9 gm of acetoxytrimethylsilane to form an end-capped phosphorus ink. 1.39 gm of tetrabutylammonium acetate was added to increase the pH of the solution to a range of about from 2 to about 3. 0.13 gm of 20% L19330 surfactant in ethanol, available from 3M of St. Paul, Minn., was added. The viscosity was about 8.5 cp at 21° C.

Synthesis of Printable Silicate Barrier Material: 100 gm ethanol, 25 gm tetraethyl orthosilicate, 21.5 gm acetic anhydride and 6.8 gm DI water were mixed in a 500 ml flask. The solution was refluxed for 9 hours. After cooling the refluxed solution to room temperature, 0.11 gm of 1% tetramethylammonium acetate in acetic acid was mixed well with 26.36 gm of the refluxed solution.

Printing: A Fujifilm Dimatix Inkjet Printer Model DMP 2811 was used to print patterns of rectangular size on 4" n-type silicon wafer using the printable boron ink, the printable phosphorous ink, and the printable silicate barrier material. The inks were jetted continuously using a 10 picoliter (pL) nozzle with a nozzle diameter of 21 um. Printing steps are described as follows:

The printable silicate barrier material, disposed within an ink cartridge, was used to print a 4 millimeter (mm)×50 mm rectangle on the n-type wafer at a drop spacing of 20 um with the stage temperature at about room temperature. The wafer then was heated in air to 500° C. for 10 minutes. The silicate barrier material-containing ink cartridge was then removed from the printer.

The printable boron ink was deposited in an ink cartridge that then was inserted into the printer and used to print a 6 mm×50 mm rectangle adjacent to a right side of the silicate barrier material rectangle. Drop spacing was 20 um and the stage temperature was about room temperature. The boron ink cartridge was then removed from the printer.

The printable phosphorus ink was deposited in an ink cartridge that then was inserted into the printer and used to print a 6 mm×50 mm rectangle adjacent to a left side of the silicate barrier material rectangle. Drop spacing was 20 um and the stage temperature was room temperature.

After printing, the final pattern consisted of three adjacent rectangles arranged in the following order: a 6 mm×50 mm phosphorus ink rectangle, a 4 mm×50 mm silicate barrier material rectangle to the right, and a 6 mm×50 mm boron ink rectangle to the right of the silicate barrier material rectangle. The printed wafer was heated to 950° C. and held at 950° C. for 30 minutes in an atmosphere of 10% oxygen and 90% nitrogen to substantially simultaneously diffuse the boron and phosphorous dopants of the boron ink and the phosphorous ink, respectively, into the printed wafer. The printed areas were marked by scribing and then immersed in a 11:1 diluted hydrofluoric acid (DHF) solution for 15 minutes for deglazing. Sheet resistance (Rs) was measured using a 4-point probe. Rs measurements were taken across the wafer starting from a region to the left of the region that underlied the phosphorous ink rectangle and were taken at intervals of 1.56 mm. Rs measurements (in units of ohms/square) are shown in the following Table 1. The region of the wafer from positions of about 3 mm to about 9 mm comprises the region that underlied the phosphorous ink rectangle before deglazing, that is, the phosphorus doped region. The region from positions of about 9 mm to about 13 mm (demonstrating the higher sheet resistance) comprises a relatively un-doped region that underlied the silicate barrier material before deglazing. The region from positions of about 13 mm to about 19 mm comprise the region that underlied the boron ink rectangle before deglazing, that is, the boron doped region.

TABLE 1

| Position of Probe (mm) | Resistivity (ohm/sq) |
|---|---|
| 0 | 168 |
| 1.56 | 167 |
| 3.12 | 23 |
| 4.68 | 21 |
| 6.24 | 29 |
| 7.8 | 19 |

TABLE 1-continued

| Position of Probe (mm) | Resistivity (ohm/sq) |
|---|---|
| 9.36 | 158 |
| 10.92 | 983 |
| 12.48 | 275 |
| 14.04 | 149 |
| 15.6 | 104 |
| 17.16 | 40 |
| 20.29 | 177 |
| 21.85 | 316 |
| 23.41 | 486 |

Accordingly, methods for substantially simultaneously forming doped regions having opposite conductivity in a semiconductor material using non-contact printing processes are provided. The methods utilize only one diffusion step to form the regions and, therefore, are time efficient. The doped regions are formed using liquid dopants having conductivity-determining type dopant elements of the opposite conductivity. The concentration of the elements in the liquid dopants and the thickness to which the liquid dopants are deposited on the semiconductor material can be selected so as to at least facilitate control of the concentration and the junction depth of the subsequently-formed doped regions. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating a semiconductor device, the method comprising the steps of:
    depositing a first liquid dopant comprising first conductivity-determining type elements overlying a first region of a semiconductor material;
    depositing a second liquid dopant comprising second conductivity-determining type elements overlying a second region of the semiconductor material, wherein the first conductivity-determining type elements and the second conductivity-determining type elements are of opposite conductivity;
    depositing a barrier material overlying the first liquid dopant, the second liquid dopant or a combination thereof, the barrier material comprising material selected from the group consisting of silicon oxides, silicon nitrides, silicon carbides, siloxanes, silsesquioxanes, silicates, including organosilicates, titanium oxide, alumina, and barium titanate; and
    simultaneously diffusing at least a portion of the first conductivity-determining type elements into the first region and at least a portion of the second conductivity-determining type elements into the second region.

2. The method of claim 1, wherein the step of simultaneously diffusing is performed using thermal annealing, infrared heating, laser heating, microwave heating, or a combination thereof.

3. The method of claim 1, wherein the step of depositing the second liquid dopant is performed before the step of depositing the first liquid dopant.

4. The method of claim 1, wherein the step of depositing the first liquid dopant and the step of depositing the second liquid dopant are performed such that the first region and the second region are substantially mutually exclusive.

5. The method of claim 4, wherein the step of depositing the barrier material is performed before the step of simultaneously diffusing and after the steps of depositing.

6. The method of claim 4, wherein the step of depositing the barrier material further comprises, before the step of simultaneously diffusing, the step of forming the barrier material overlying a third region of the semiconductor material, wherein the third region is substantially mutually exclusive of the first region and the second region.

7. The method of claim 6, wherein the step of forming comprises depositing the barrier material using a non-contact printing process.

8. The method of claim 6, wherein the step of forming comprises depositing the barrier material using a spin-on or spray-on technique and subsequently patterning the barrier material.

9. The method of claim 6, wherein the step of forming comprises depositing the barrier material using chemical vapor deposition and subsequently patterning the barrier material.

10. The method of claim 1, wherein the step of depositing the barrier material comprises the step of depositing the barrier material overlying the first liquid dopant before the step of depositing the second liquid dopant and after the step of depositing the first liquid dopant.

11. The method of claim 10, wherein the step of depositing the barrier material comprises depositing the barrier material using a non-contact printing process.

12. The method of claim 11, wherein the step of depositing the barrier material comprises depositing a material selected from the group consisting of end-capped siloxanes, end-capped silsesquioxanes, and end-capped silicates, including end-capped organosilicates.

13. The method of claim 1, wherein the step of depositing the second liquid dopant comprises depositing the second liquid dopant overlying the second region and at least a portion of the first liquid dopant.

14. The method of claim 1, wherein the step of depositing the first liquid dopant comprises depositing the first liquid dopant using an inkjet printer or an aerosol jet printer.

15. The method of claim 1, wherein the step of depositing the second liquid dopant comprises depositing the second liquid dopant using an inkjet printer or an aerosol jet printer.

16. The method of claim 1, wherein the step of depositing the second liquid dopant comprises depositing the second liquid dopant by a spin-on technique.

17. The method of claim 1, wherein the step of depositing the second liquid dopant comprises depositing the second liquid dopant by a spray-on technique.

18. The method of claim 1, wherein the step of depositing the first liquid dopant comprises the step of depositing the first liquid dopant comprising the first conductivity-determining type elements and a silicate carrier.

19. A method for fabricating a semiconductor device, the method comprising the steps of:

depositing a first dopant comprising n-type dopant elements overlying a first region of a semiconductor material using a non-contact printing process;

depositing a second dopant comprising p-type dopant elements overlying a second region of the semiconductor material;

depositing a barrier material overlying the first liquid dopant, the second liquid dopant or a combination thereof, the barrier material comprising material selected from the group consisting of silicon oxides, silicon nitrides, silicon carbides, siloxanes, silsesquioxanes, silicates, including organosilicates, titanium oxide, alumina, and barium titanate; and simultaneously diffusing at least a portion of the n-type dopant elements into the first region and at least a portion of the p-type dopant elements into the second region.

20. The method of claim 19, wherein the step of simultaneously diffusing is performed using thermal annealing, infrared heating, laser heating, microwave heating, or a combination thereof.

21. The method of claim 19, wherein the step of depositing the first dopant and the step of depositing the second dopant are performed such that the first region and the second region are substantially mutually exclusive.

22. The method of claim 21, wherein the step of depositing the barrier material comprises, before the step of simultaneously diffusing, the step of forming the barrier material overlying a third region of the semiconductor material, wherein the third region is substantially mutually exclusive of the first region and the second region.

23. The method of claim 22, wherein the step of forming comprises depositing the barrier material using a non-contact printing process.

24. The method of claim 22, wherein the step of forming comprises depositing the barrier material using a spin-on or spray-on technique and subsequently patterning the barrier material.

25. The method of claim 22, wherein the step of forming comprises depositing the barrier material using chemical vapor deposition and subsequently patterning the barrier material.

26. The method of claim 19, wherein the step of depositing the barrier material is performed before the step of simultaneously diffusing and after the steps of depositing.

27. The method of claim 19, wherein the step of depositing the barrier material comprises the step of depositing the barrier material overlying the first dopant before the step of depositing the second dopant and after the step of depositing the first dopant.

28. The method of claim 27, wherein the step of depositing the barrier material comprises depositing the barrier material using a non-contact printing process.

29. The method of claim 19, wherein the step of depositing the second dopant comprises depositing the second dopant overlying the second region and at least a portion of the first dopant.

30. The method of claim 19, wherein the step of depositing the first dopant comprises depositing the first dopant using an inkjet printer or an aerosol jet printer.

31. The method of claim 19, wherein the step of depositing the second dopant comprises depositing the second dopant using an inkjet printer or an aerosol jet printer.

* * * * *